US009726488B2

(12) United States Patent
Peng et al.

(10) Patent No.: US 9,726,488 B2
(45) Date of Patent: Aug. 8, 2017

(54) HEADING CALIBRATION METHOD AND COMPASS SENSOR USING THE SAME

(71) Applicants: Sheng-Yang Peng, Hsinchu (TW); Tzu-Yi Wu, Kaohsiung (TW)

(72) Inventors: Sheng-Yang Peng, Hsinchu (TW); Tzu-Yi Wu, Kaohsiung (TW)

(73) Assignee: ITE Tech. Inc., Hsinchu (TW)

(*) Notice: Subject to any disclaimer, the term of this patent is extended or adjusted under 35 U.S.C. 154(b) by 858 days.

(21) Appl. No.: 14/156,464

(22) Filed: Jan. 16, 2014

(65) Prior Publication Data

US 2015/0032399 A1    Jan. 29, 2015

(30) Foreign Application Priority Data

Jul. 29, 2013   (TW) .............................. 102127173 A

(51) Int. Cl.
  *G01C 17/38*  (2006.01)
  *G01R 33/00*  (2006.01)
  *G01C 17/28*  (2006.01)

(52) U.S. Cl.
  CPC ......... *G01C 17/38* (2013.01); *G01R 33/0035* (2013.01); *G01C 17/28* (2013.01)

(58) Field of Classification Search
  CPC .................................................. G01C 17/38
  See application file for complete search history.

(56) References Cited

U.S. PATENT DOCUMENTS 6,408,251 B1 * 6/2002 Azuma ............... G01C 17/38
                                          701/530
7,613,581 B2   11/2009 Skvortsov et al.
(Continued)

FOREIGN PATENT DOCUMENTS

| CN | 101149262  | 2/2011 |
| JP | 2006038464 | 2/2006 |
| TW | 200905166  | 2/2009 |

OTHER PUBLICATIONS

"Office Action of Taiwan Counterpart Application", issued on Dec. 22, 2014, p. 1-p. 4.

*Primary Examiner* — John Breene
*Assistant Examiner* — Jeffrey C Morgan
(74) *Attorney, Agent, or Firm* — Jianq Chyun IP Office

(57) ABSTRACT

A heading calibration method, adapted for a compass sensor is provided. The heading calibration method includes the following steps. R data segments are sequentially generated by rotating the compass sensor by a predetermined angle, wherein the data segments includes a plurality of magnetic data respectively. A partial calibration process is executed to calibrate a reference point coordinate according to the magnetic data in $r^{th}$ data segment and a initial value of the reference point coordinate, wherein r is between 1 and the R. Parts of the magnetic data in the $r^{th}$ data segment is extracted as whole data, and a whole calibration process is executed according to the whole data to update an initial value of the reference point coordinate. The partial calibration process is executed according to the updated initial value of the reference point coordinate and the magnetic data in a $(r+1)^{th}$ data segment.

12 Claims, 4 Drawing Sheets

(56) References Cited

U.S. PATENT DOCUMENTS

2008/0071492 A1* 3/2008 Skvortsov .............. G01C 17/38
   702/92
2009/0299686 A1 12/2009 Ho
2011/0077889 A1* 3/2011 Vogt ....................... G01C 17/38
   702/93

* cited by examiner

HEADING CALIBRATION METHOD AND COMPASS SENSOR USING THE SAME

CROSS-REFERENCE TO RELATED APPLICATION

This application claims the priority benefit of Taiwan application serial no. 102127173, filed on Jul. 29, 2013. The entirety of the above-mentioned patent application is hereby incorporated by reference herein and made a part of this specification.

BACKGROUND

Technical Field

The invention relates to an electronic device. Particularly, the invention relates to a compass sensor in an electronic device and a heading calibration method thereof.

Related Art

Along with progress of technology, regarding operations and control of an electronic device, besides operations performed by using keyboards or an operation interface displayed on a touch screen, there are also many operation applications generated according to determination of an orientation and a moving state of the electronic device itself or an externally connected remote device (for example, a game device and a control handle thereof), for example, a direction of a racing car in a game executed by the electronic device can be controlled by swaying the electronic device.

Generally, regarding a method for measuring an orientation of an object, an accelerometer and a compass sensor configured in the electronic device can be used to obtain sensing data, and through calculation of an Euler angle or quaternion equation, a current posture and orientation of the electronic device can be obtained. Moreover, a sensor fusion could also be implemented by adding data sensed by a gyroscope sensor configured in the electronic device. The main operation principle of the sensor fusion is that an inclining angle of an object is obtained according to a variation amount of acceleration of gravity detected by the accelerometer, and a horizontal heading angle is obtained according to a magnetic variation (i.e. the aforementioned sensing data) detected by the compass sensor. Thereafter, the aforementioned inclining angle and the horizontal heading angle are synthesized to obtain the current orientation and inclining state of the electronic device.

However, when there is magnetic field interference in the ambient environment, the magnetic variation detected by the compass sensor may cause an error, such that the estimated horizontal heading angle also has an error. Therefore, in order to obtain an accurate horizontal heading angle, a magnetic calibration would be generally executed before the heading angle estimation, so as to eliminate the magnetic field interference.

In the conventional technique, many processing methods can be used to implement the aforementioned magnetic calibration, for example, a center point of a circle is obtained according to a characteristic of a planar circle, and the obtained circle center is a magnetic offset reference value. The method of obtaining the circle center may include averaging a plurality of coordinates corresponding to the data sensed by the compass sensor to serve as the circle center, or averaging coordinates corresponding to a maximum value and a minimum value in the data sensed by the compass sensor to serve as the circle center. However, the magnetic calibration performed according to the characteristic of the planar circle is too simple and inaccurate. A reason thereof is that in an actual environment, the magnetic field has a 3D spatial distribution rather than a planar distribution, so that the magnetic calibration performed according to the characteristic of the planar circle may result in an inaccurate result, and is liable to be influenced by environment variation. Therefore, how to obtain the magnetic offset reference value through a simple method and ensure that the magnetic offset reference value is not easy to be influenced by the magnetic field of the ambient environment to cause error are problems of the field required to be resolved.

SUMMARY

Accordingly, the invention is directed to a heading calibration method and a compass sensor, which is capable of calibrating an error of the compass sensor through a simple calculation method.

The invention provides a heading calibration method, which is adapted to a compass sensor, the heading calibration method includes the following steps. First, R data segments are sequentially generated by rotating the compass sensor by a predetermined angle, where the R data segments include a plurality of magnetic data respectively. A partial calibration process is executed to calibrate a reference point coordinate of the compass sensor according to the magnetic data in a $r^{th}$ data segment and an initial value of the reference point coordinate. A sampling interval is taken as a unit to extract parts of the magnetic data in the $r^{th}$ data segment as whole data, and a whole calibration process is executed according to the whole data to update the initial value of the reference point coordinate. Moreover, the partial calibration process is executed according to the updated initial value of the reference point coordinate and the magnetic data in a $(r+1)^{th}$ data segment.

The invention provides a compass sensor including a magnetic detection unit and a processing unit. The magnetic detection unit sequentially generates R data segments by rotating the compass sensor by a predetermined angle, where the R data segments include a plurality of magnetic data respectively. The processing unit is coupled to the magnetic detection unit. The processing unit executes a partial calibration process to calibrate a reference point coordinate of the compass sensor according to the magnetic data in a $r^{th}$ data segment and an initial value of the reference point coordinate. The processing unit takes a sampling interval as a unit to extract parts of the magnetic data in the $r^{th}$ data segment as whole data, and executes a whole calibration process according to the whole data to update the initial value of the reference point coordinate, where r is between 1 and R−1. Moreover, the processing unit executes the partial calibration process according to the updated initial value of the reference point coordinate and the magnetic data in a $(r+1)^{th}$ data segment.

According to the above descriptions, the invention provides a heading calibration method and a compass sensor, in which the whole calibration process is periodically executed to update the initial value of the reference point coordinate, and the partial calibration process is executed according to the updated initial value of the reference point coordinate to accurately calibrate the reference point coordinate, i.e. a magnetic offset reference value.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

In an actual environment, since the magnetic field has a 3D spatial distribution rather than a planar distribution, the magnetic calibration performed according to the characteristic of the planar circle may result in an inaccurate result, and is liable to be influenced by environment variation. In the present invention, the method of obtaining a circle center (which is corresponding to a magnetic offset reference value) is extended to obtain a spherical center (which is also corresponding to the magnetic offset reference value) according to a characteristic of a three-dimensional sphere. In the following descriptions, it is assumed that all reference points (a reference point coordinate) to be obtained are spherical center coordinates of a sphere.

Figure 1:
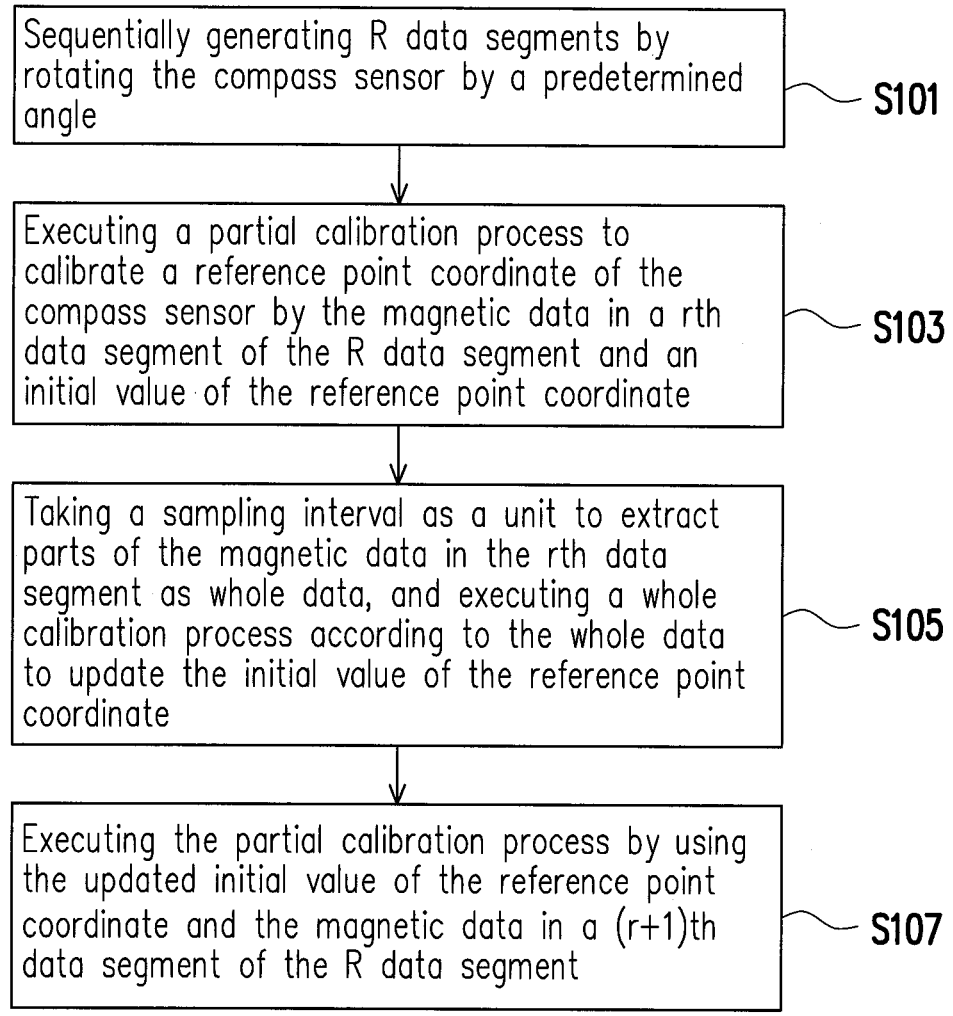
FIG. 1 is a flowchart illustrating a heading calibration method according to an embodiment of the invention.

FIG. 1 is a flowchart illustrating a heading calibration method according to an embodiment of the invention. The heading calibration method is adapted to a compass sensor. Referring to FIG. 1, in step S101, R data segments are sequentially generated by rotating the compass sensor by a predetermined angle, where the R data segments include a plurality of magnetic data respectively. Generally, the predetermined angle is 360 degrees, though the predetermined angle can still be adjusted according to an actual requirement. Then, in step S103, a partial calibration process is executed to calibrate a reference point coordinate of the compass sensor according to the magnetic data in a $r^{th}$ data segment and an initial value of the reference point coordinate. Thereafter, in step S105, a sampling interval is taken as a unit to extract parts of the magnetic data in the $r^{th}$ data segment as whole data, and a whole calibration process is executed according to the whole data to update the initial value of the reference point coordinate. Moreover, in step S107, the partial calibration process is executed according to the updated initial value of the reference point coordinate and the magnetic data in a $(r+1)^{th}$ data segment.

In other words, in the present invention, the initial value of the reference point coordinate is first set to zero, and a plurality of magnetic data continuous on time points (corresponding to the $r^{th}$ data segment) are used to execute the partial calibration process to obtain the approximate reference point coordinate. Then, the whole calibration process is executed to update the initial value of the reference point coordinate according to a plurality of magnetic data (the aforementioned whole data, i.e. a plurality of magnetic data spaced by sampling intervals) having intervals on time points, such that the next time when the partial calibration process is executed according to different magnetic data (e.g., corresponding to the $(r+1)^{th}$ data segment), the execution could be performed according to the updated initial value of the reference point coordinate. In brief, the initial value of the reference point coordinate can be regarded as an approximate solution of magnetic offset value obtained according to the whole data. During a next stage, the partial calibration process executed according the magnetic data in the $(r+1)^{th}$ data segment may approximate an optimal solution of the magnetic offset value according to the above approximate solution, and the above execution is repeatedly performed to the R data segments to continuously output the updated reference point coordinate.

In an embodiment of the invention, the partial calibration process includes inputting the magnetic data value of the $r^{th}$ data segment into a least square fitting function to approximate the reference point coordinate to be obtained in an iterative approach. It is assumed that the initial value the reference point coordinate to be obtained is $(a_I, b_I, c_I)$, and the approximate reference point coordinate obtained by using the least square fitting function is $(\hat{a}, \hat{b}, \hat{c})$, the approximate reference point coordinate $(\hat{a}, \hat{b}, \hat{c})$ can be represented by the following equation:

$$\hat{a} = \frac{1}{n}\sum_{i=1}^{n} x_i + r\frac{1}{n}\sum_{i=1}^{n} \frac{a_I - x_i}{L_i} \quad (1)$$

$$\hat{b} = \frac{1}{n}\sum_{i=1}^{n} y_i + r\frac{1}{n}\sum_{i=1}^{n} \frac{b_I - y_i}{L_i},$$

where $$\hat{c} = \frac{1}{n}\sum_{i=1}^{n} z_i + r\frac{1}{n}\sum_{i=1}^{n} \frac{c_I - z_i}{L_i}$$

$$L_i = \sqrt{(x_i - a_I)^2 + (y_i - b_I)^2 + (z_i - c_I)^2},$$

$$r = \frac{1}{n}\sum_{i=1}^{n} L_i$$

In the above equation (1), the value i is between 1 and n, and the value n is the number of the magnetic data values required to be input to the least square fitting function in one operation. Namely, in one partial calibration process, multiple operations of the least square fitting function may be performed. Moreover, to facilitate the calculation, in an embodiment of the invention, the value n can be set as a power of 2. For example, in a fix point calculation, when the value n is set as a power of 2, and when n is in the denominator, the dividing operation can be directly implemented through a shifting calculation. However, the invention is not limited to the above setting. $(a_I, b_I, c_I)$ is the initial value of the reference point coordinate, which could be initially set to (0,0,0), and would be updated through execution of the whole calibration process.

The operation of the whole calibration process is described below. As described above, when the whole calibration process is executed, a plurality batches of magnetic data (i.e. the whole data) having intervals on time points (i.e., the sampling interval) are first obtained from the $r^{th}$ data segment. The number of batches of the whole data and selection of the sampling interval are determined according to different data output rate of the compass sensor. If each batch of magnetic data is used in analysis of the whole data, excessive calculation resources of a calculation unit in the compass sensor are occupied. If the data output rate of the compass sensor is high, a larger sampling interval is used to extract the whole data, and if the data output rate of the compass sensor is low, a smaller sampling interval is used to extract the whole data. In this way, the initial value of the reference point coordinate ($a_I$, $b_I$, $c_I$) can be effectively obtained.

Figure 2A:
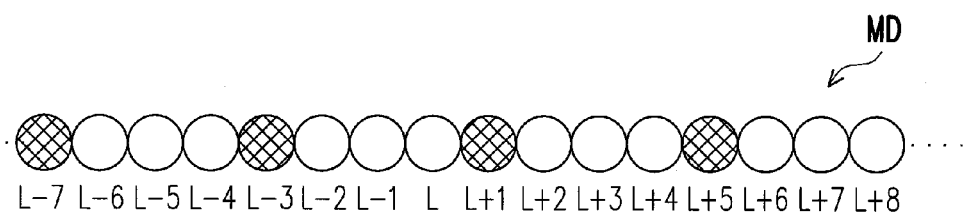
FIG. 2A and FIG. 2B are schematic diagrams illustrating relationships between magnetic data and whole data according to an embodiment of the invention.
Figure 2B:
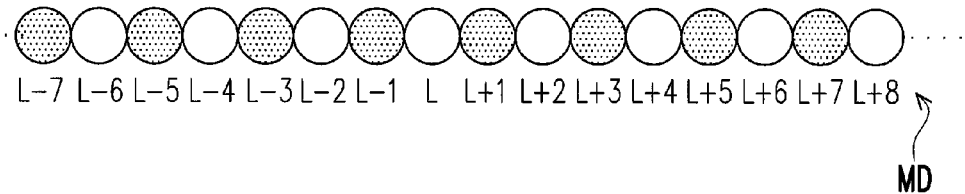

FIG. 2A and FIG. 2B are schematic diagrams illustrating relationships between the magnetic data and the whole data according to an embodiment of the invention. In the embodiment of FIG. 2A and FIG. 2B, regarding the same magnetic data MD (($L-7$)$^{th}$ magnetic data to ($L+8$)$^{th}$ magnetic data, total 16 batches of magnetic data), different sampling intervals are used to obtain the whole data. Referring to FIG. 2A, the sampling interval is 4, so that 16/4=4 batches of the magnetic data MD are extracted to serve as the whole data, and intervals between the 4 batches of the magnetic data MD (($L-7$)$^{th}$, ($L-3$)$^{th}$, ($L+1$)$^{th}$ and ($L+5$)$^{th}$ magnetic data MD (corresponding to those having plaid lines in FIG. 2A)) are all the sampling intervals of 4. Referring to FIG. 2B, the sampling interval is 2, so that 16/2=8 batches of the magnetic data MD are extracted to serve as the whole data, and intervals between the 8 batches of the magnetic data MD (($L-7$)$^{th}$, ($L-5$)$^{th}$, ($L-3$)$^{th}$, ($L-1$)$^{th}$, ($L+1$)$^{th}$, ($L+3$)$^{th}$, ($L+5$)$^{th}$ and ($L+7$)$^{th}$ magnetic data MD (corresponding to those having plaid lines in FIG. 2B)) are all the sampling intervals of 2. Comparing FIG. 2A with FIG. 2B, the configuration of the sampling interval of 4 of FIG. 2A is adapted to the compass sensor with higher data output rate, and the configuration of the sampling interval of 2 of FIG. 2B is adapted to the compass sensor with lower data output rate.

For example, it is assumed that the data output rate of the compass sensor is 100 hertz (Hz), and the sampling interval is 10, i.e. the compass sensor may generate 100 batches of magnetic data per second, and if the 100 batches of magnetic data serve as the $r^{th}$ data segment, 10 batches of magnetic data are extracted from the 100 batches of magnetic data to serve as the whole data, wherein the extracted magnetic data are spaced by 10 batches of magnetic data from each other. In the same embodiment, when the sampling interval can be 5, and the number of batches of the whole data is still fixed to 10, extraction of the whole data can be completed within 0.5 second. In another embodiment of the invention, the sampling interval is not a fixed value, which can be arbitrarily set, or the interval between the magnetic data used for extracting the whole data can be set according to a specific algorithm, and the invention is not limited thereto.

In the whole calibration process, the extracted whole data is used for generating an initial value calibration matrix A, and the whole calibration process may obtain the initial value of the reference point coordinate ($a_I$, $b_I$, $c_I$) according to a following equation:

$$A \cdot p = q, \quad (2)$$

where $$A = \begin{bmatrix} -2x_1 & -2y_1 & -2z_1 & 1 \\ -2x_2 & -2y_2 & -2z_2 & 1 \\ \cdots & \cdots & \cdots & \cdots \\ -2x_M & -2y_M & -2z_M & 1 \end{bmatrix}_{M \times 4},$$

$$p = \begin{bmatrix} a_I \\ b_I \\ c_I \\ a_I^2 + b_I^2 + c_I^2 - r_c^2 \end{bmatrix}_{4 \times 1},$$

$$q = \begin{bmatrix} -x_1^2 - y_1^2 - z_1^2 \\ -x_2^2 - y_2^2 - z_2^2 \\ \cdots \\ -x_M^2 - y_M^2 - z_M^2 \end{bmatrix}_{M \times 1}$$

In the above equation (2), the value M is the number of batches of the whole data, and $r_c$ is a radius of a sphere with a spherical center of the initial value ($a_I$, $b_I$, $c_I$) that is obtained according to the above whole calibration process.

As described above, in the present embodiment, the initial value of the reference point coordinate ($a_I$, $b_I$, $c_I$) can be regarded as an approximate solution of a magnetic offset reference value. By observing the above equation (2) and the initial value calibration matrix A, it is known that according to a multiplication result of the initial value calibration matrix A and an inverse matrix thereof, whether the initial value of the reference point coordinate ($a_I$, $b_I$, $c_I$) is changed or not could be verified. For example, it is assumed that correlation of the above extracted whole data is high (i.e. linear correlation), which represents that a difference between the magnetic data detected by the compass sensor is very small, and the electronic device having the compass sensor is currently in a static state, or has a very small moving range.

In this case, the inner product of the initial value calibration matrix A and the inverse matrix thereof does not approach to an expected unit matrix. In case of an actual operation, if correlation between vectors (corresponding to each of the whole data of the invention) in the matrix is high, a determinant of the matrix (the initial value calibration matrix A) approaches to 0, such that an inverse matrix of the calibration matrix A does not exist. In this case, during a process of calculating the inverse matrix, values in the matrix are divergent due to dividing of the determinant value, which results in a fact that diagonal elements of the multiplication result of the matrix and the inverse matrix thereof cannot form the unit matrix.

On the other hand, if correlation between the extracted whole data is low (i.e. linear independence is high), it represents that the difference between the magnetic data detected by the compass sensor is large, and the electronic device having the compass sensor is currently rotated, or has a significant movement. According to the above analysis, in the present invention, before the above whole calibration process is performed, a determination is performed according to a following equation (3):

$$(A^T A)_{4 \times 4}^{-1} (A^T A)_{4 \times 4} \cong I = \begin{bmatrix} 1 & 0 & 0 & 0 \\ 0 & 1 & 0 & 0 \\ 0 & 0 & 1 & 0 \\ 0 & 0 & 0 & 1 \end{bmatrix}_{4 \times 4} \quad (3)$$

Where, a main purpose of multiplying the initial value calibration matrix A by a transpose matrix is that a multiplication result of the initial value calibration matrix A and the transpose matrix is a square matrix, which could be used for calculating the inverse matrix. The setting of approximating the unit matrix rather than purely equivalent to the unit matrix in the equation (3) is because of a quantization error probably generated during the fix point calculation. When the above equation (3) is not true, it represents that the correlation between the whole data is very high, and the electronic device is currently in a static state, or has a very small moving range, and it is unnecessary to perform the whole calibration process to update the current initial value of the reference point coordinate. When the above equation (3) is true, it represents that the correlation between the whole data is very low, and the electronic device is currently rotated, or has a significant movement, and the whole calibration process is required to be performed to update the current initial value of the reference point coordinate.

Figure 3:
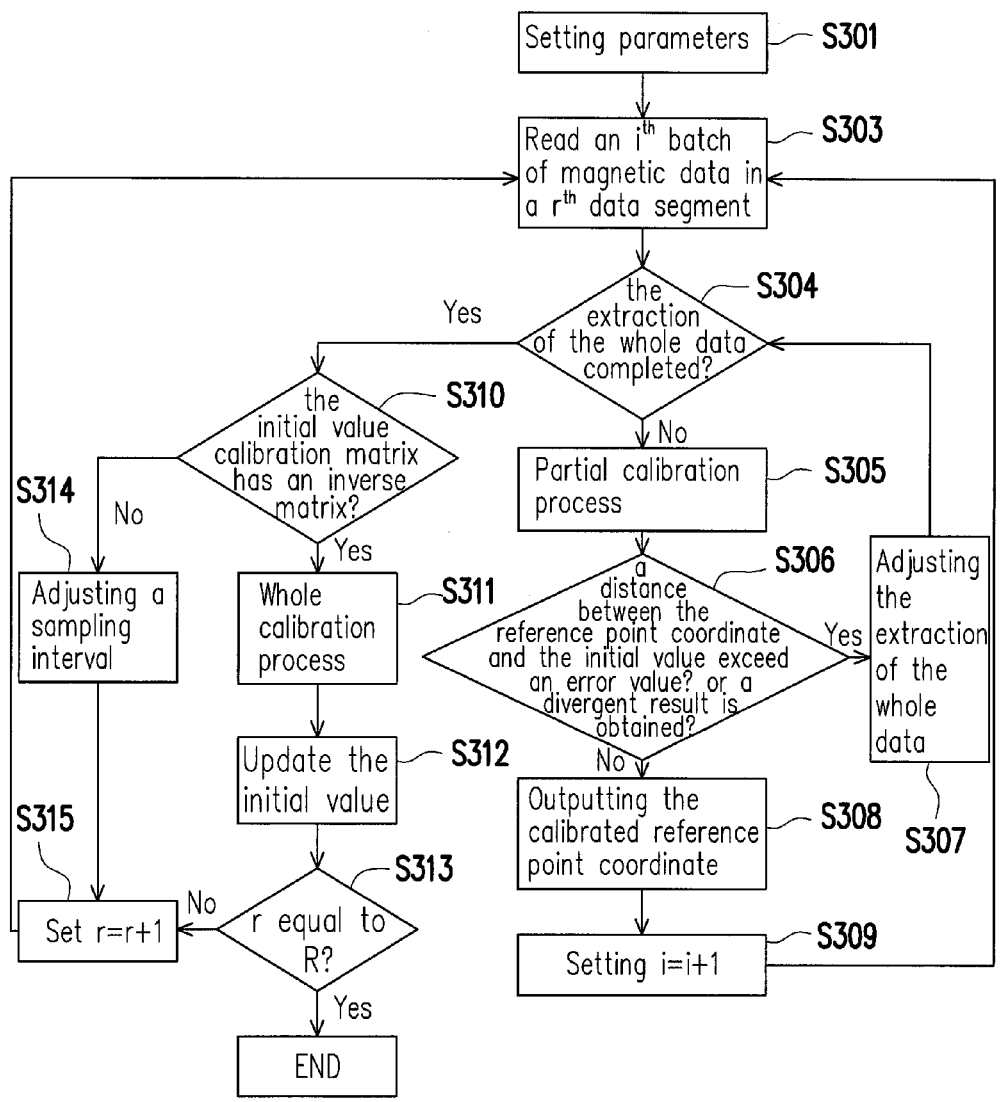
FIG. 3 is a flowchart illustrating a heading calibration method according to an embodiment of the invention.

Moreover, in the present embodiment, a size of the sampling interval can be adjusted according to the determination of whether the equation (3) is true. For example, when the correlation between the extracted whole data is high, it represents that the electronic device has a small movement, and it is unnecessary to quickly update the initial value of the reference point coordinate, so that the size of the sampling interval can be increased to decrease the number of times of performing determination of the equation (3) and the whole calibration process. Conversely, when the correlation between the extracted whole data is low, it represents that the electronic device has a large movement, and the size of the sampling interval can be decreased to increase the number of times of performing determination of the equation (3) and the whole calibration process, so as to opportunely update the initial value of the reference point coordinate, and calibration of the calculated magnetic offset value can be more efficient. However, it should be noticed that in case that the number of batches of the whole data (corresponding to the value M of the equation (3)) is fixed, a length of the $r^{th}$ data segment can be adjusted according to the size of the sampling interval. On the other hand, a magnitude of the value M, i.e. the whole data extracted from the $r^{th}$ data segment can also be adjusted according to an actual requirement. An implementation of the heading calibration method of the invention is described below. FIG. 3 is a flowchart illustrating a heading calibration method according to an embodiment of the invention. Referring to FIG. 3, in step S301, various parameters used in the heading calibration method are set, for example, the length of the data segment, the size of the sampling interval, the number of batches of the whole data, and the value n in the partial calibration process.

Then, in step S303, an $i^{th}$ batch of magnetic data in the $r^{th}$ data segment is sequentially read, where the value r is started from 1 and is between 1 and R−1, and the value R is the number of the data segments, and the value i is started from 1 and is between 1 and I, and the value I is the number of batches of the magnetic data in each data segment. It should be noticed that in the present embodiment, R data segments and I batches of magnetic data respectively included in the R data segments are sequentially generated by rotating the compass sensor by a predetermined angle (for example, 360 degrees), and the $i^{th}$ batch of magnetic data in the $r^{th}$ data segment is read. Before the read magnetic data reaches a bottom of the data segment (i.e. the value i is equal to the value I), i.e. extraction of the whole data is not yet completed (step S304, "no"), the partial calibrating process (i.e. corresponding to the calculation of the above equation (1)) is executed according to the read magnetic data (i.e. the first batch of magnetic data to the $i^{th}$ batch of magnetic data in the $r^{th}$ data segment) and the initial value of the reference point coordinate, so as to calibrate the reference point coordinate (step S305). The initial value of the reference point coordinate is an initial value obtained by executing the whole calibration process by using a $(r−1)^{th}$ data segment. If r is 1, the initial value is set to (0, 0, 0).

When a distance between the calibrated reference point coordinate obtained by executing the aforementioned partial calibration process and the initial value of the reference point coordinate exceeds an error value, or when the aforementioned partial calibration process obtains a divergent result (step S306, "yes"), extraction of the whole data is adjusted (step S307), and the flow returns to the step S304 to regenerate the initial value of the reference point coordinate.

Extraction adjustment of the whole data may include following situations. One situation is to re-extract the whole data, and now the whole data probably includes a part of magnetic data in the $r^{th}$ magnetic segment and a part of magnetic data in the $(r−1)^{th}$ data segment. For example, the $r^{th}$ data segment is the second data segment, which includes a $101^{st}$ to $200^{th}$ batch of magnetic data generated by the compass sensor, and the $(r−1)^{th}$ data segment is the first data segment, which includes a $1^{st}$ to $100^{th}$ batch of magnetic data, and when a $150^{th}$ batch of magnetic data of the second data segment is read/generated (i.e. r=2 and i=50), if the distance between the calibrated reference point and the initial value of the reference point coordinate exceeds the error value or the partial calibration process obtains the divergent result, in step S307, half of the whole data extracted from the $101^{st}$ to $200^{th}$ batch of magnetic data can be maintained (for example, the number of batches of the whole data is 10, 5 batches of the whole data extracted from the $101^{st}$ to $150^{th}$ batch of magnetic data), and the other half of the whole data are extracted from the $1^{st}$ to $100^{th}$ batch of magnetic data in the first data segment (for example, 5 batches of the whole data extracted from the $51^{st}$ to $100^{th}$ batch of magnetic data)

Another situation is to adjust the sampling interval (for example, to decrease the sampling interval, so that a situation of extracting 10 batches of magnetic data from the 100 batches of magnetic data to serve as the whole data is changed to a situation of extracting 20 or 30 batches of magnetic data to serve as the whole data), and retract the whole data from the first data segment (or even the magnetic data that have already read in the second data segment). The implementations in the above two situations could also be implemented together, and the invention is not limited to the above implementations.

When the distance between the calibrated reference point coordinate obtained through the partial calibration process and the initial value of the reference point coordinate is smaller than an error value (step S306, "no"), the reference point coordinate calibrated by the partial calibration process is output (step S308), and after the calibrated reference point coordinate is output, i=i+1 is set to read a next batch of magnetic data in the $r^{th}$ data segment (step S309).

When extraction of the whole data is completed (for example, after all batches of the magnetic data in the $r^{th}$ data segment are read (i.e. I batches of the magnetic data), or extraction of the whole data is adjusted through the step S307 and the magnetic data is re-extracted), the initial value calibration matrix A is generated according to the whole data, and the aforementioned equation (3) could be used to determine whether the initial value calibration matrix A has an inverse matrix (step S310). When the initial value calibration matrix A has the inverse matrix, it represents that the correlation between the magnetic data in the whole data is low, and the whole calibration process is executed according to the initial value calibration matrix A to generate the new initial value of the reference point coordinate (step S311), and update the initial value of the reference point coordinate, and the updated initial value is used in) the partial calibration process performed according to a next data segment (the $(r+1)^{th}$ data segment) (step S312). After the initial value of the reference point coordinate is updated, the partial calibration process and the whole calibration process are executed on the next data segment (the $(r+1)^{th}$ data segment) (step S315, r=r+1 is set, and the steps S304-S315 are re-executed in allusion to the $(r+1)^{th}$ data segment), until the steps S304-S315 are re-executed by using the $R^{th}$ data segment (in step S313, r=R is determined).

It should be noticed that since execution of the partial calibration process requires n batches of magnetic data, in the partial calibration process executed in allusion to the $(r+1)^{th}$ data segment, the magnetic data in the $r^{th}$ data segment is required in some cases. For example, when the $r^{th}$ data segment includes the $101^{st}$ to $200^{th}$ batch of magnetic data generated by the compass sensor, and the $(r-1)^{th}$ data segment includes the $1^{st}$ to $100^{th}$ magnetic data, i.e. it is set that I=100, r=2, and the value n is 8. when the $101^{st}$ batch of magnetic data is read (i.e. the first magnetic data in the $r^{th}$ data segment), the partial calibration process extracts 8 continuous batches of magnetic data, i.e. in the (r−1)th data segment, the $93^{rd}$ to $100^{th}$ batch of magnetic data and the aforementioned $101^{st}$ batch of magnetic data are used to perform the partial calibration process, and others are deduced by analogy. When r=1, and the $r^{th}$ data segment includes the $1^{st}$ to the $100^{th}$ batch of magnetic data, the partial calibration process probably extracts inadequate batches (smaller than n) of magnetic data. For example, in the above embodiment, when the $5^{th}$ batch of magnetic data is read, the partial calibration process directly performs the operation according to the 5 batches of magnetic data.

Moreover, it should be noticed that when the steps S303-S315 are executed in allusion to the $r^{th}$ data segment, the magnetic data in the $r^{th}$ data segment is continually generated, and is sequentially read. The $r^{th}$ magnetic data including the $101^{st}$ to $200^{th}$ batch of magnetic data generated by the compass sensor of the aforementioned embodiment is taken as an example, when the $101^{st}$ to $199^{th}$ batch of magnetic data are read, the steps S305-S309 are all executed (whether the step S307 is executed or not would be determined according to the determination result of the step S306), and in the step S308, the reference point coordinate would be output. When the $200^{th}$ batch of magnetic data is read, in the step S304, it is determined that extraction of the whole data is completed (the step S304, "yes") and the whole calibration process is executed (steps S304-S315), and in the step S312, the initial value is updated. In conclusion, in a general case (i.e. the determination result of the step S310 is not "no", and the determination result of the step S306 is not "yes"), in allusion to the $r^{th}$ data segment, 99 times of the partial calibration process would be executed and one whole calibration process would be executed. However, if the determination result of the step S306 is "yes", the number of times of executing the whole calibration process would probably increases due to execution of the step S307.

When it is determined that the initial value calibration matrix A does not have the inverse matrix by using the aforementioned equation (3) (step S308, "no"), it represents that correlation between various batches of magnetic data in the whole data is high, and the electronic device having the compass sensor does not have a significant movement, so that the sampling interval can be increased, and the initial value of the reference point coordinate would not be updated (step S311). It should be noticed that when the size of the data segment is set to be fixed, by increasing the sampling interval, the number of batches of the whole data obtained in a single data segment is decreased. When the number of batches of the whole data is set to be fixed, by increasing the sampling interval, the length (i.e. the value I) of the data segment is synchronously increased, and a start point of a next data segment (for example, $(r+1)^{th}$ data segment would also be adjusted backwards.

In the step S314, adjustment of the sampling interval could be implemented selectively, and when the initial value calibration matrix A does not have the inverse matrix, the sampling interval is unnecessary to be adjusted, and the initial value of the reference point coordinate is not updated, and the partial calibration process and the whole calibration process are directly executed on a next data segment (the $(r+1)^{th}$ data segment) according to the existing initial value (step S315, r=r+1 is set, and the steps S303-S315 are re-executed on the $(r+1)^{th}$ data segment). In an embodiment of the invention, before the step S314 is executed, an accumulation number of the calibration matrices not having the inverse matrix is first accumulated, and when the accumulation number is greater than a threshold, the step S314 is executed to adjust the sampling interval (the length of the data segment is probably adjusted simultaneously due to a setting of the data segment and a setting of the whole data).

By repeatedly executing the aforementioned steps to the R data segments, estimation of a spherical center (a, b, c) is completed, and calibration of the compass sensor is further completed according to the estimation of the spherical center (a, b, c), and the compass sensor can accurately calculate a current heading angle thereof in the electronic device. It should be noticed that the value R could be increased along with the magnetic data generated by the compass sensor. Namely, when the compass sensor is used, the value R is continuously increased, and the steps S303-S315 of FIG. 3 are continuously executed (since the determination result of the step S313 is "no"). For example, the electronic device enables the compass sensor to determine the heading angle or a current tilting state of the electronic device, for example, when the user uses the electronic device to execute a game or an application requiring to determine the heading angle or the current tilting state of the electronic device, in case that the game or the application is executed, the steps S303-S315 are continuously executed corresponding to the continuously generated magnetic data, so as to keep generating the calibrated reference point coordinate according to the updated initial value.

Figure 4:
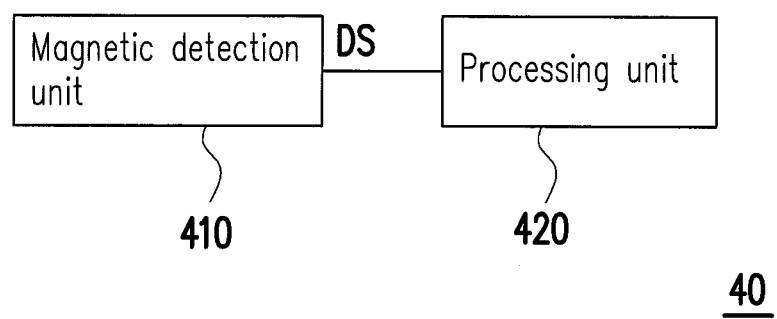
FIG. 4 is a functional block diagram of a compass sensor according to an embodiment of the invention.

The invention also provides a compass sensor, which is adapted to execute a heading angle calibration method, and is adapted to be configured in an electronic device for using together with an accelerometer and a gyroscope sensor, etc. FIG. 4 is a functional block diagram of a compass sensor according to an embodiment of the invention. Referring to FIG. 4, the compass sensor 40 includes a magnetic detection unit 410 and a processing unit 420. The magnetic detection unit 410 sequentially generates R data segments DS by rotating a predetermined angle (for example, 360 degrees or other angles), where the R data segments DS include a plurality of magnetic data respectively. The processing unit 420 is coupled to the magnetic detection unit 410.

The processing unit 420 executes a partial calibration process to calibrate a reference point coordinate of the compass sensor 40 according to the magnetic data in a $r^{th}$ data segment and an initial value of the reference point coordinate, where the value r is between 1 and R−1. The processing unit 420 takes a sampling interval as a unit to extract parts of the magnetic data in the $r^{th}$ data segment as whole data, and executes a whole calibration process according to the whole data to update the initial value of the reference point coordinate. Moreover, the processing unit 420 executes the partial calibration process according to the updated initial value of the reference point coordinate and the magnetic data in a $(r+1)^{th}$ data segment. A detailed implementation of the compass sensor 40 may refer to the embodiments of FIG. 1-FIG. 3 and related descriptions thereof, which is not repeated.

In summary, the invention provides a heading calibration method and a compass sensor using the same, in which the partial calibration process is used in collaboration with the whole calibration process to approximate a magnetic offset reference value, i.e., the reference point coordinate, or in other words, the spherical center (a, b, c). Since the whole calibration process requires a plurality of multiplication operations, and according to a current moving state of the compass sensor (and the electronic device in which the compass sensor is configured), the sampling interval is dynamically adjusted, i.e. the execution times of the whole calibration process is adjusted, the steps of operation is reduced and the aforementioned reference point coordinate can still be accurately obtained. Since there are different magnetic interferences in different environments, the heading calibration method provided by the invention can continuously update the reference point coordinate, and the magnetic offset reference value can be continuously updated/modified properly, so as to achieve an optimal measuring effect of the compass sensor for the heading angle.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A heading calibration method, adapted to a compass sensor, the heading calibration method comprising:
sequentially generating R data segments by rotating the compass sensor by a predetermined angle, wherein the R data segments respectively comprise a plurality of magnetic data;
executing a partial calibration process to calibrate a reference point coordinate of the compass sensor according to the magnetic data in a $r^{th}$ data segment of the R data segments and an initial value of the reference point coordinate, wherein r is between 1 and R−1;
taking a sampling interval as a unit to extract parts of the magnetic data in the $r^{th}$ data segment as whole data, and executing a whole calibration process according to the whole data to update the initial value of the reference point coordinate; and
executing the partial calibration process according to the updated initial value of the reference point coordinate and the magnetic data in a $(r+1)^{th}$ data segment of the R data segments.

2. The heading calibration method as claimed in claim 1, wherein the step of executing the partial calibration process according to the initial value of the reference point coordinate and the magnetic data in the $(r+1)^{th}$ data segment of the R data segments comprises:
re-extracting the whole data and executing the whole calibration process according to the re-extracted whole data when a distance between the initial value of the reference point coordinate and the reference point coordinate obtained by executing the partial calibration process according to the initial value of the reference point coordinate and the magnetic data in the $(r+1)^{th}$ data segment exceeds an error value.

3. The heading calibration method as claimed in claim 1, wherein the step of executing the partial calibration process according to the initial value of the reference point coordinate and the magnetic data in the $(r+1)^{th}$ data segment further comprises:
not to calibrate the reference point coordinate when a divergent result is obtained by executing the partial calibration process according to the initial value of the reference point coordinate and the magnetic data in the $(r+1)^{th}$ data segment.

4. The heading calibration method as claimed in claim 1, wherein before the step of executing the whole calibration process according to the whole data, the heading calibration method further comprises:
generating an initial value calibration matrix by using the whole data, and determining whether the initial value calibration matrix has an inverse matrix;
not to execute the whole calibration process and not to update the initial value of the reference point coordinate when the inverse matrix of the initial value calibration matrix does not exist; and
executing the whole calibration process according to the initial value calibration matrix when the inverse matrix of the initial value calibration matrix exists.

5. The heading calibration method as claimed in claim 4, wherein the initial value calibration matrix is A, and the step of determining whether the initial value calibration matrix has the inverse matrix comprises determining whether a following equation is true:

$$(A^T A)^{-1}(A^T A) \cong 1$$

wherein I is a unit matrix, and when the above equation is true, the initial value calibration matrix has the inverse matrix is determined.

6. The heading calibration method as claimed in claim 4, wherein after the step of generating the initial value calibration matrix by using the whole data, and determining whether the initial value calibration matrix has the inverse matrix, the heading calibration method comprises:
accumulating an accumulation number of the initial value calibration matrices not having the inverse matrix, and adjusting the sampling interval, a data length of the $r^{th}$ data segment and/or a data length of the $(r+1)^{th}$ data segment when the accumulation number reaches a threshold.

7. A compass sensor, comprising:
a magnetic detection unit, sequentially generating R data segments by rotating a predetermined angle, wherein the R data segments respectively comprise a plurality of magnetic data;
a processing unit, coupled to the magnetic detection unit, wherein the processing unit executes a partial calibration process to calibrate a reference point coordinate according to the magnetic data in a $r^{th}$ data segment of the R data segments and an initial value of the reference point coordinate, wherein r is between 1 and R−1,
the processing unit takes a sampling interval as a unit to extract parts of the magnetic data in the $r^{th}$ data segment as whole data, and executes a whole calibration process according to the whole data to update the initial value of the reference point coordinate, and
the processing unit executes the partial calibration process according to the updated initial value of the reference point coordinate and the magnetic data in a $(r+1)^{th}$ data segment of the R data segments.

8. The compass sensor as claimed in claim 7, wherein when a distance between the initial value of the reference point coordinate and the reference point coordinate obtained by executing the partial calibration process according to the initial value of the reference point coordinate and the magnetic data in the $(r+1)^{th}$ data segment exceeds an error value, the processing unit re-extracts the whole data and executes the whole calibration process according to the re-extracted whole data.

9. The compass sensor as claimed in claim 7, wherein the reference point coordinate is not calibrated when a divergent result is obtained by executing the partial calibration process according to the initial value of the reference point coordinate and the magnetic data in the $(r+1)^{th}$ data segment of the R data segments.

10. The compass sensor as claimed in claim 7, wherein
the processing unit generates an initial value calibration matrix by using the whole data, and determines whether the initial value calibration matrix has an inverse matrix;
when the inverse matrix of the initial value calibration matrix does not exist, the processing unit does not execute the whole calibration process and does not update the initial value of the reference point coordinate; and
when the inverse matrix of the initial value calibration matrix exists, the processing unit executes the whole calibration process according to the initial value calibration matrix.

11. The compass sensor as claimed in claim 10, wherein the initial value calibration matrix is A, and the processing unit determines whether a following equation is true:

$$(A^T A)^{-1}(A^T A) \approx I$$

wherein I is a unit matrix, and when the above equation is true, the processing unit determines that the initial value calibration matrix has the inverse matrix.

12. The compass sensor as claimed in claim 10, wherein the processing unit accumulates an accumulation number of the initial value calibration matrices not having the inverse matrix, and adjusts the sampling interval and/or a data length of the $r^{th}$ data segment and the $(r+1)^{th}$ data segment when the accumulation number reaches a threshold.

* * * * *